United States Patent [19]

Terashima et al.

[11] Patent Number: 4,606,037

[45] Date of Patent: Aug. 12, 1986

[54] APPARATUS FOR MANUFACTURING SEMICONDUCTOR SINGLE CRYSTAL

[75] Inventors: Kazutaka Terashima, Ebina; Tsuguo Fukuda, Yokohama, both of Japan

[73] Assignees: Agency of Industrial Science & Technology; Ministry of International Trade & Industry, both of Tokyo, Japan

[21] Appl. No.: 571,194

[22] Filed: Jan. 16, 1984

[30] Foreign Application Priority Data

Jan. 18, 1983 [JP] Japan .................................... 58-5182
Apr. 27, 1983 [JP] Japan ................................... 58-73037

[51] Int. Cl.$^4$ ........................................... H05B 11/00
[52] U.S. Cl. ....................................... 373/6; 373/109; 373/117; 373/128
[58] Field of Search ............... 373/128, 109, 111, 117, 373/118, 127, 132, 134, 119, 122, 5, 6, 7; 156/616 R, 616 A, 617 R, 617 SP, 617 V; 422/245, 248, 249, 254

[56] References Cited

U.S. PATENT DOCUMENTS

| | | | |
|---|---|---|---|
| 3,057,936 | 10/1962 | Hill | 373/128 |
| 3,257,492 | 6/1966 | Westeren | 373/132 |
| 3,359,077 | 12/1967 | Arst | 156/617 SP |
| 4,410,796 | 10/1983 | Wilsey | 373/132 |

Primary Examiner—Roy N. Envall, Jr.
Attorney, Agent, or Firm—Oblon, Fisher, Spivak, McClelland & Maier

[57] ABSTRACT

The heater member of a furnace for heating the crucible used for fusing raw materials for a semiconductor single crystal is provided with reinforcing members made of a material such as alumina or pyrolytic boron nitride which excels in electric insulating property, resistance to heat, and strength. When a magnetic field with an alternating current or pulsating current of electricity is applied to the site of single crystal growth for the purpose of stabilizing the growth of the single crystal, the furnace tends to sustain breakage. These reinforcing members thus used on the heater member impart improved durability to the furnace and enable the apparatus as a whole to enjoy a long service life.

10 Claims, 7 Drawing Figures

APPARATUS FOR MANUFACTURING SEMICONDUCTOR SINGLE CRYSTAL

BACKGROUND OF THE INVENTION

This invention relates to an apparatus for manufacturing a semiconductor single crystal, and more particularly to an apparatus for manufacturing a semiconductor single crystal designed to effect growth of the semiconductor single crystal by pulling a fused mixture of raw materials for the semiconductor single crystal from a crucible heated by a resistance furnace while keeping a magnetic field applied to the crucible.

Among compounds of the elements of Families III-V, gallium arsenide (GaAs) exhibits especially outstanding electron mobility and is finding extensive utility as the crystalline substrate for elements in ultra-high speed integrated circuits and optoelectronic integrated circuits. GaAs is attracting keen attention because (1) when it is of high quality it acquires a high insulating property exceeding $10^7 \Omega.cm$ in specific resistance, (2) it can be manufactured in a grade having minimal intra-crystalline defects and enjoying even distribution of such defects, and (3) it can be easily manufactured in large wafers, for example. As a method capable of manufacturing a GaAs single crystal fulfilling all these requirements, the liquid-encapsulated Czochralski method (LEC method) is receiving increasing attention. This liquid-encapsulated Czochralski method is known to be available in either of the two versions; a low-pressure version and a high-pressure version. Since the low-pressure liquid-encapsulated Czochralski method uses as its starting material the GaAs polycrystal formed by the boat growth method, the single crystal suffers from low purity of raw material and requires incorporation of chromium (Cr), a substance capable of imparting a semi-insulating property to the crystal. The high-pressure liquid-encapsulated Czochralski method which effects synthesis directly on the starting material requires no addition of chromium. Since this method heats and synthesizes Ga and As, the raw material for crystal, and boron oxide ($B_2O_3$), a liquid sealant, under high pressure, the fused mixture of raw materials for crystal in the crucible assumes a highly unstable state in the presence of thermal convection. Since this method effects the operation of crystal growth under such an unstable state, the shape of the solid-liquid boundary varies greatly and the growth crystal suffers from occurrence of fine striation and fine defects due to thermal variation and tends to entail dislocation and heterogeneous distribution of impurities. An integrated circuit of uniform electric property and device property cannot be easily manufactured with high repeatability using a crystal thus grown as its substrate since the defects so entailed in the crystal substrate cannot be controlled.

Concerning the manufacture of a single crystal of silicon (Si) or indium antimonide (InSb), the idea of effecting this manufacture by a procedure of pulling the crystal while under application of a magnetic field has been reported in literature. It has been found that when a magnetic field is applied to the aforementioned fused liquid of GaAs, generation of thermal convection within the fused liquid is repressed and the growth of crystal is consequently allowed to proceed with the solid-liquid boundary kept in a stable condition and, therefore, a GaAs single crystal of high quality can be obtained without entailing occurrence of striation.

Generally, the resistance furnace of the apparatus for the manufacture of such a single crystal is applied with and heated by alternating current or pulsating current. When the resistance furnace is exposed to a magnetic field, the magnetic force tends to exert a strong force on to the heater member of the furnace and cause damage thereto. To avoid this difficulty, Japanese Patent Application Disclosure Sho No. 56(1981)-45889 suggests use of direct current in the place of alternating current. Conversion of such a large amount of electric power as is consumed in the resistance furnace into a direct current is not easy. Further in most cases, the apparatus used for pulling a single crystal is designed to be operated with an AC power source. Thus, the use of direct current inevitably requires the apparatus to be remodeled to a great extent. Even when the apparatus is adapted to operate with a DC power source, the heater member of the furnace vibrates as the magnetic field to be applied increases beyond a certain level. As the vibration of the heater member is transmitted to the crucible, the effect of the application of the magnetic field is lost and the opposite effect is consequently induced. Thus, a semiconductor single crystal of high quality cannot be manufactured.

As described above, the convection of the fused mixture of raw materials for the crystal within the crucible can be repressed and a single crystal of high quality can be manufactured by applying a magnetic field to the neighborhood of the solid-liquid boundary of the fused mixture. Generally, the device used for the purpose of applying the magnetic field in the apparatus makes use of a pair of magnets disposed as fixed stationarily on the floor surface one each on diametrically opposite sides of the device used for pulling the crystal. To permit application of a powerful magnetic field, the magnets have a large volume and a heavy weight. They are fixed in an immovable state at the optimum positions selected relative to the crystal pulling device.

In the operation of pulling the crystal, it is necessary to (1) check the rotary driving unit of the crystal pulling device for possible effect of the application of magnetic field, (2) charge the device with the raw materials for the crystal, (3) mechanically adjust the device, (4) remove the formed crystal, and (5) clean the device. Particularly in the manufacture of GaAs single crystal, the multiplicity of carbon members used within the furnace must be cleaned after each batch operation. In the circumstances, there has been felt a pressing need for the development of an apparatus for the manufacture of a semiconductor single crystal, provided with a magnetic field applying device which concentrically applies a magnetic field near the solid-liquid boundary of the fused mixture of raw materials for the crystal, which permits easy handling, and which enables the various operations involved in crystal pulling to be carried out safely and quickly.

SUMMARY OF THE INVENTION

An object of this invention is to provide an apparatus for the manufacture of a semiconductor single crystal which uses an AC power source for the resistance furnace and curbs breakage of the heater member of the furnace under application of a magnetic field.

Another object of this invention is to provide an apparatus for the manufacture of a semiconductor single crystal which curbs vibration of the crucible containing therein the fused mixture of raw materials for the crystal even under application of a large magnetic field.

Yet another object of the present invention is to provide an apparatus for the manufacture of a semiconductor single crystal which is provided with a magnetic field applying device capable of safely and efficiently performing various operations to be performed on the device for pulling the crystal.

To accomplish the objects described above according to the present invention, there is provided an apparatus for the manufacture of a semiconductor single crystal which comprises a furnace provided with a heater member and adapted to incorporate a crucible within the inner space thereof, a reinforcing member for reinforcing the heater member of the aforementioned furnace, and a magnetic field applying device formed of a pair of magnet means opposed to the lateral sides of the aforementioned furnace across a space.

Generally when the magnetic field is applied to the crystal pulling device as described above, the magnetic force is exerted upon the heater member of the furnace, causing vibration and breakage of the heater member. In the apparatus of the present invention, the heater member is prevented from vibration and breakage because it is reinforced. Further, since an AC power source is used for the furnace, the magnetic field to be applied can be easily increased.

The reinforcing member is formed of a material such as, for example, alumina, pyrolytic boron nitride, or boron nitride, which is an insulator excelling in resistance to heat.

In another aspect of the invention, the magnetic field applying device of the furnace apparatus is provided with means for selectively moving the magnetic field applying device to a position at which it can apply a magnetic field to a furnace and to a position at which a magnetic field can not be applied to the furnace.

In yet another aspect of the magnetic field applying device, the same is formed of a pair of magnet means which are supported on support bases which are provided with wheels on their lower ends and which are interconnected with a cross bar.

In still another aspect of the invention, the magnetic field applying device has an annular shape and is positioned in a manner such that it encircles the furnace. The magnetic field applying device is provided with a means of moving the annular device in a vertical direction.

Since the magnet means of the magnetic field applying device which are opposed to the lateral sides of the furnace can be disposed so as to be moved by suitable moving means, the various operations to be performed on the crystal pulling device can be carried out safely and efficiently.

The other objects and the other characteristics of the present invention will become apparent to those skilled in the art as the further disclosure of the invention is made in the following detailed description with reference to the accompanying drawings.

DESCRIPTION OF THE PREFERRED EMBODIMENT

Figure 1:
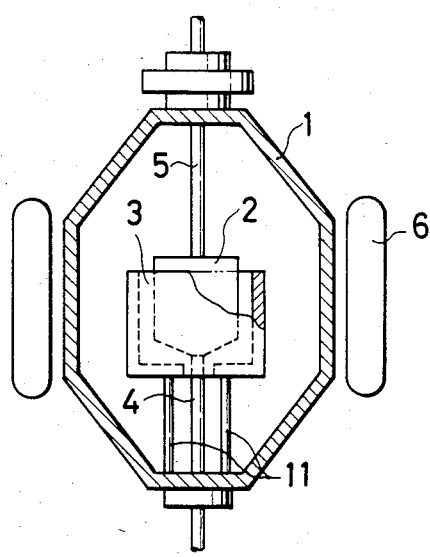
FIG. 1 is a schematic cross section illustrating one typical apparatus for the manufacture of a semiconductor single crystal provided with a magnetic field applying device.

FIG. 1 is a schematic representation of the construction of an apparatus for the manufacture of a single crystal by the procedure of the high-pressure LEC method known as a method for the direct synthesis of a GaAs single crystal. Inside a high-pressure vessel 1, is disposed a crucible 2 of quartz or boron nitride sheathed with a supporting member such as of a carbonaceous material. This crucible 2 is supported by a rotary support shaft 4 so as to be rotated and moved vertically. The crucible 2 is encircled with a resistance furnace 3 adapted to heat the crucible 2 to a prescribed temperature and keep it at that elevated temperature. Above the crucible 2 is suspended a pulling shaft 5 having a seed crystal fixed to the lower end thereof. This pulling shaft 5 is adapted to be rotated about its axis and moved vertically along the axis. A magnetic field applying device 6 is disposed around the high-pressure vessel 1 to apply a magnetic field to the fused mixture 5 of raw material for the crystal held inside the crucible 2. The magnetic field applying device 6 may be either of the superconducting type or of the normal conducting type.

Figure 2:
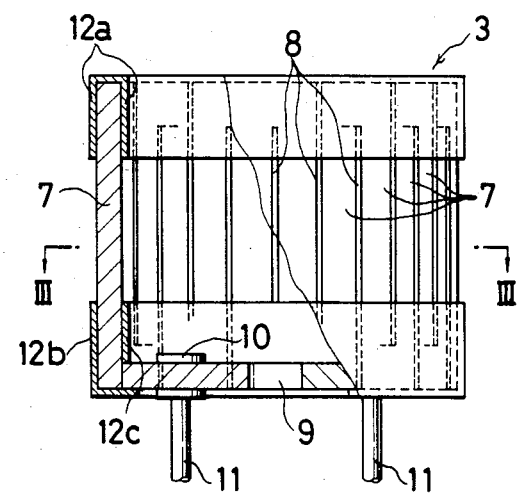
FIG. 2 is a partially sectioned side view illustrating a furnace in an apparatus for the manufacture of a single crystal according to the present invention.

The furnace 3, as illustrated in FIG. 2, has in the lateral side thereof a comb-shaped graphite heater member 7 the teeth of which are circumferentially spaced and as insulating members 8 interposed between the adjacent heater teeth to enhance the stability of the furnace as a whole against feeble vibration. At the center of the bottom surface of the furnace 3, there is formed a hole 9 for permitting passage of the rotary shaft supporting the crucible in position. From the bottom surface, heater electrodes 11 are projected downwardly. These heater electrodes 11 are connected with screws 10 to the heater member 7. (FIG. 3)

Figure 3:
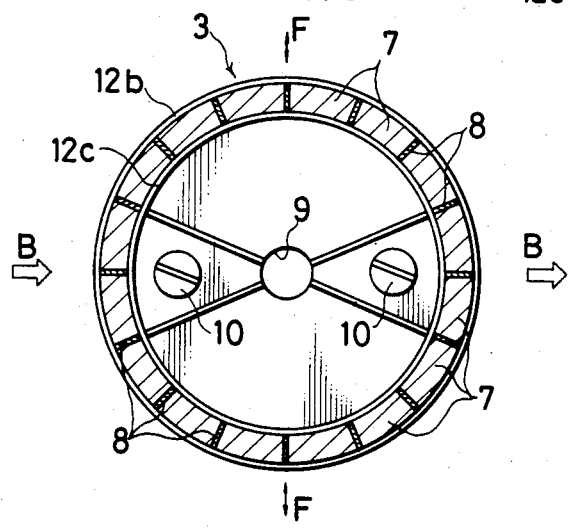
FIG. 3 is a plan view illustrating a section of the furnace of FIG. 2 along the line III—III.

When a magnetic field is applied sidewise as indicated by the arrow ("B") in FIG. 3 to the furnace of the construction described above, there is exerted a force attracting the heater member in the direction deviating by 90° from the direction of the magnetic force (the arrow "F"). Particularly when an alternating current or pulsating current is applied, since the direction in which the force is applied to the heater member is constantly varied, the heater member develops fatigue rapidly and tend to sustain breakage easily.

In an actual experiment, when an alternating current of 200 V, 50 Hz, 450 A was applied to a cylindrical heater 20 cm in diameter, 20 cm in height (having a circular comb-shaped with teeth measuring about 2 cm in width and 0.7 cm in thickness) to apply a magnetic field of 500 gausses, the heater member began to vibrate. When the applied magnetic field was increased to 1,000 gausses, a tensile force of about 8 kg was exerted on the heater member. When the applied magnetic field was further increased to 2,000 gausses, the tensile force exerted to the heater member rose to about 16 kg. When the magnetic field was raised to 3,000 gausses, the tensile force rose over 25 kg and caused breakage of the heater member.

Even in the furnace designed to operate with a DC power source, a tensile strength is exerted upon the heater member so that when the magnitude of the magnetic field is elevated, the heater member begins to vibrate and tends to sustain breakage. When the pulling of the crystal is carried out under this condition, the vibration is transmitted to the crucible holding therein the fused mixture of raw materials for the crystal to induce vibration of the fused mixture. Consequently, the application of the magnetic field fails to bring about the expected effect of permitting manufacture of a single crystal of high quality.

In view of the drawback described above, the present invention has the heater member directly reinforced with insulating reinforcing members. The upper end of the heater member 7 is reinforced by being capped with an annular reinforcing member 12a having a cross section substantially of the shape of the letter "U". The lower end of the heater member 7 is reinforced by being squeezed inwardly with an annular reinforcing member 12b having a cross section substantially of the shape of the letter "L", with the perpendicular sides of the letter "L" pressed against the outer surface and the bottom surface of the heater member. The reinforcement of the lower end of the heater member 7 is further enhanced by having an annular member 12c pressed against the inner lower side of the heater member. Once the heater member is reinforced with such reinforcing members as described above, the opposite end of the heater member is immobilized with the reinforcing member. When the magnetic field is applied while the furnace is operating with an alternating current or pulsating current, the tensile strength consequently exerted upon the heater member does not induce any vibration in the heater member which is held fast by the reinforcing members. Thus, the heater member is prevented from accumulating fatigue and eventually sustaining breakage. The heater member, therefore, enjoys a notably improved service life.

As a material for these reinforcing members, there can be used alumina, pyrolytic boron nitride, or boron nitride which is an insulator having resistance to heat. The shapes and dimensions of these reinforcing members ought to be suitably selected to avoid adversely affecting the thermal efficiency of the furnace. Particularly since the heater member is liable to sustain breakage inwardly from the leading end thereof owing to external impacts such as vibration, it is necessary that it should be constructed to have such vulnerable part retained immovably.

For example, a heater member having the same dimensions as described above was reinforced on the upper and lower ends and on the inner lower side as illustrated in FIG. 2 by using an annular reinforcing member of a cross section of the shape of the letter "U", an annular reinforcing member of a cross section of the shape of the letter "L", and an annular reinforcing member, all made of alumina plate about 2 mm in thickness (all having a height of about 3 cm) and operated with an AC power source. When a magnetic field of 3,000 gausses was applied to this heater member, absolutely no vibration was generated in the heater member thereof.

When a large furnace capable of heating a crucible 6 inches in diameter was heated by application of a DC potential difference, an unreinforced heater member of the furnace vibrated on exposure to a magnetic field of a large magnitude. When this heater member was reinforced in the same manner as described above, it was not observed to generate any vibration on exposure to the same magnetic field. Thus, the heater member enjoyed a notable increase in its service life.

Examples of species of single crystal effectively manufactured by the apparatus of this invention include single-element semiconductors such as Si and Ge, III–V group compound semiconductors such as GaAs, InP, InSb, and GaSb, II–IV group compound semiconductors such as CdTe, ZnSe, and ZnS, IV–VI group compound semiconductors such as PbTe, $Pb_{1-x}Sn_xTe$, and mixed crystals thereof.

The pulling of a single crystal under application of a magnetic field of a magnitude exceeding 1,000 gausses cannot be materialized unless there is used an apparatus for the manufacture of single crystal which has the heater member of its furnace reinforced as described above. During the manufacture of the single crystal by use of this apparatus, the occurrence of thermal convection is repressed and the fluctuation of temperature in the neighborhood of the solid-liquid boundary of the fused mixture of the raw materials for crystal is notably diminished. Consequently, the single crystal manufactured enjoys high quality and the pulling speed of the crystal can be increased to several times the level prevalent to date.

Figure 4:
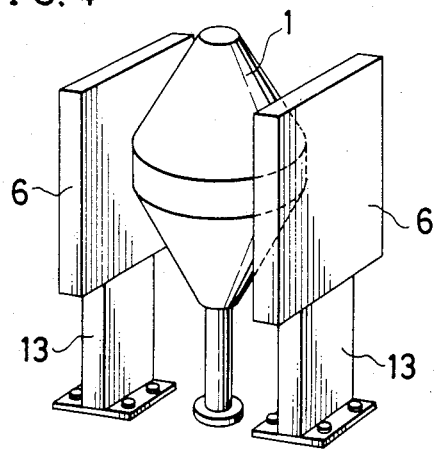
FIG. 4 is a schematic perspective explanatory view of the apparatus for the manufacture of a single crystal, having a magnetic field applying device disposed laterally along the furnace.

An overall construction of the apparatus for the manufacture of a single crystal provided with the furnace of the aforementioned structure is illustrated in FIG. 4. Referring to the drawing, a high-pressure vessel 1 containing therein the aforementioned furnace is interposed between a pair of opposed magnets as magnetic field applying devices 6, which are supported fast on the floor surface with respective support bases 13. These magnetic field applying devices have considerable weight. In the illustrated embodiment, there is used a super-conducting magnet. Once they are fixed in the optimum positions selected relative to the high-pressure vessel, they are generally left unmoved. Therefore, the apparatus is installed stationarilly as in this embodiment. When an operation such as charging the crucible with the raw materials for crystal, mechanically adjusting the high-pressure vessel, removing the produced single crystal from the apparatus, or cleaning the interior of the high-pressure vessel is to be performed, the juxaposition of the magnetic field applying devices 6 with the high-pressure vessel leads to interference with the operation and impairs the safety and efficiency of the work.

An apparatus for the manufacture of a single crystal which is adapted to enable the crystal pulling work to be efficiently carried out will be described with reference to FIG. 5. A high-pressure vessel 1 to be used for pulling the single crystal is interposed between a pair of opposed magnetic field applying devices 6, which are supported by their respective support bases 13. The support bases 13 which support the magnetic field applying devices 6 are provided on the bottom sides thereof with wheels 14 so that the pair of support bases may travel on a pair of rails 15 laid parallelly to each other on the opposite sides of the high-pressure vessel 1.

net is to be moved in the vertical direction, therefore, these weights 28 enable the annular magnet 22 to be smoothly moved without entailing any vibration.

In the apparatus of the construction described above, the movement of the magnetic field applying device to its operating position can be accomplished by rotating the threaded bars with their respective motors thereby moving the support moving members in the vertical direction and, after the annular magnet has reached the level prescribed with respect to the high-pressure vessel, discontinuing the rotation of the motors. At this time, the application of magnetic field is started and the work of crystal pulling is simultaneously started within the high-pressure vessel. After the crystal thus pulled has attained prescribed growth, it is removed from the apparatus. Then, the threaded bars are rotated by their respective motors in the direction of moving the annular magnet in the descending direction and the rotation of the motors is stopped after the annular magnet has fallen to the prescribed position. When the annular magnet is fixed at this position, the interior of the apparatus is cleaned. The regulation of the annular magnet at the operating position and the non-operating position of the magnetic field applying device can be safely effected by attaching micro-switches one each to the corresponding positions of the reinforcing members so that when the annular magnet reaches the prescribed positions, these micro-switches will be actuated to effect automatic stop of the rotation of the respective motors.

When the magnetic field applying device is thus provided with suitable moving means, the various operations such as charging of the crucible with the raw materials for crystal, removing of the produced crystal, and cleaning of the interior of the apparatus can be effected as smoothly as in the apparatus not provided with the magnetic field applying device. Owing to the application of magnetic field to the crucible during the growth of crystal, the single crystal can be manufactured with high quality.

The moving means for the magnetic field applying device is not necessarily limited to that of the mechanism shown in the illustrated embodiment. Other moving means of any mechanism capable of moving the magnetic field applying device to the operating position and the non-operating position of the magnetic field applying device can be adopted instead.

Figure 5:
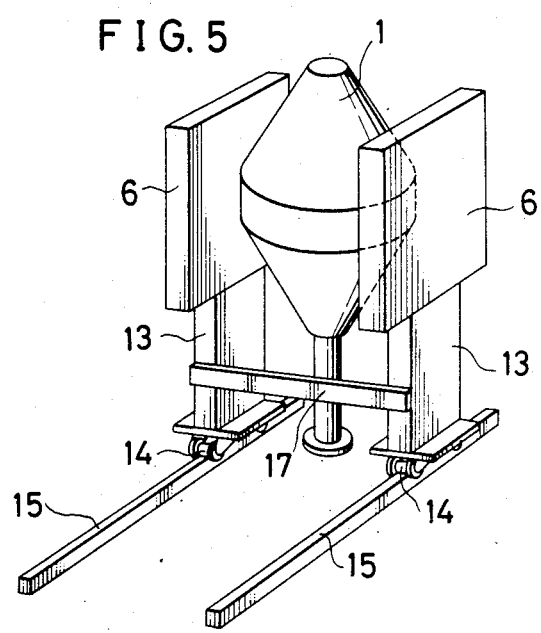
FIG. 5 is a schematic perspective view illustrating a typical movable magnetic field applying device to be used for the apparatus of this invention for the manufacture of a single crystal.
Figure 6:
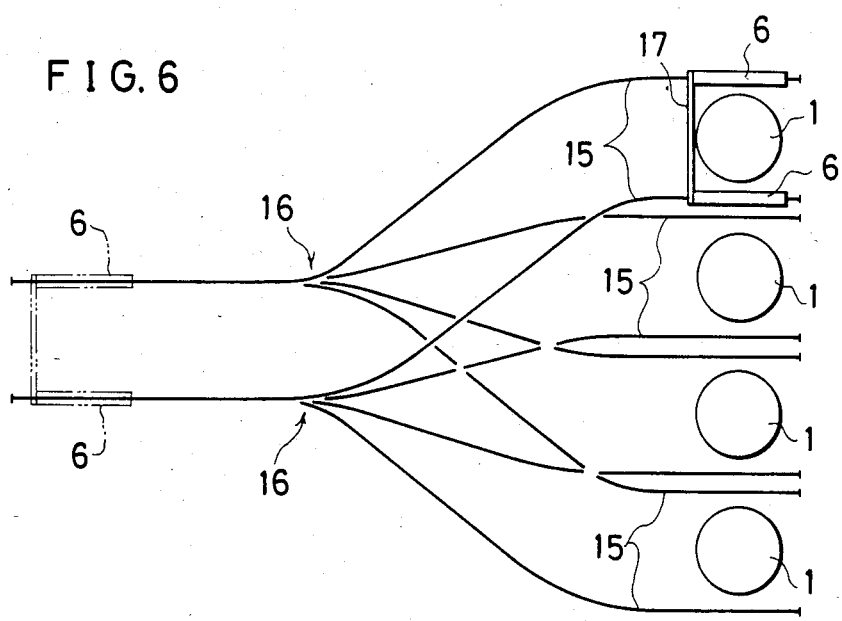
FIG. 6 is an explanatory diagram illustrating a typical condition under which the magnetic field applying device of FIG. 5 is put to use.

In the embodiments illustrated in FIG. 5 and FIG. 6, because of the provision of the aforementioned wheels, the movement of the magnetic field applying devices can be easily accomplished manually. Optionally, this movement may be effected mechanically.

Figure 7:
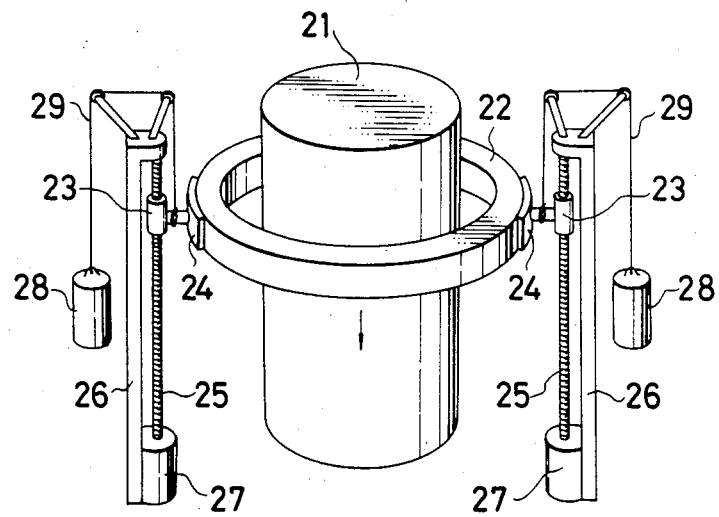
FIG. 7 is a schematic perspective view illustrating another typical apparatus for the manufacture of a single crystal according to this invention.

In the embodiment of FIG. 7, the motors are utilized for the movement of the magnetic field applying device. Optionally, there may be adopted a mechanism enabling the magnetic field applying device to be manually moved.

As is clear from the foregoing description, the present invention contemplates reinforcing the heater member of the furnace with reinforcing members. Thus, the invention can be applied without any alteration to the existing apparatus for the manufacture of a single crystal which is adapted to operate with an AC power source. By effecting the growth of crystal simultaneously with the application of magnetic field, the occurrence of striation can be curbed and the production of a single crystal of high quality can be ensured. When this invention is applied to an apparatus for the manufacture of a single crystal which is adapted to operate with a DC power source, the service life of the heater member in the furnace can be notably improved and the growth of crystal under application of a powerful magnetic field can be easily accomplished. Thus, a single crystal of excellent quality can be formed.

What is claimed is:

1. An apparatus for the manufacture of a semiconductor single crystal, comprising a furnace possessing a heater member adapted to heat a crucible for fusing raw materials for the crystal, insulative thermally resistant reinforcing members for reinforcing said heater member of said furnace, and a magnetic field applying device formed of at least one magnet means opposed across a space to the lateral side of said furnace.

2. An apparatus according to claim 1, wherein said reinforcing members comprise an annular member of a cross section substantially of the shape of the letter "U" to be fitted to the upper end of said heater member, an annular member of a cross section substantially of the shape of the letter "L" to be fitted to the lower peripheral side of said heater member, and an annular member to be fitted to the lower inner side of said heater member.

3. An apparatus according to claim 1, wherein said reinforcing members are made of alumina.

4. An apparatus according to claim 2, wherein said component reinforcing members are made of alumina.

5. An apparatus according to claim 1, wherein said reinforcing members are made of pyrolytic boron nitride.

6. An apparatus according to claim 2, wherein said component reinforcing members are made of pyrolytic boron nitride.

7. An apparatus according to claim 1, wherein said magnetic field applying device is further provided with means for selectively moving said magnetic field applying device to a position for application of magnetic field to said furnace and to a position not for application of magnetic field.

8. An apparatus according to claim 1, wherein said magnetic field applying device is formed of a pair of magnet means which are supported on support bases provided at the lower ends thereof with wheels and are interconnected with a cross bar.

9. An apparatus according to claim 8, wherein the support bases for said magnet means are provided on the bottom sides thereof with wheels.

10. An apparatus according to claim 1, wherein said magnet field applying device has an annular shape and is disposed in a manner encircling said furnace and is provided with means for moving said annular device in a vertical direction.

* * * * *